United States Patent
Irissou et al.

(10) Patent No.: US 6,690,078 B1
(45) Date of Patent: Feb. 10, 2004

(54) SHIELDED PLANAR DIELECTRICALLY ISOLATED HIGH SPEED PIN PHOTODIODE AND METHOD FOR PRODUCING SAME

(75) Inventors: Pierre R. Irissou, Sunnyvale, CA (US); Brian B. North, Los Gatos, CA (US); Wayne T. Holcombe, Palo Alto, CA (US); Stephen F. Colaco, Santa Cruz, CA (US)

(73) Assignee: Integration Associates, Inc., Mountain View, CA (US)

( * ) Notice: Subject to any disclaimer, the term of this patent is extended or adjusted under 35 U.S.C. 154(b) by 148 days.

(21) Appl. No.: 09/632,836

(22) Filed: Aug. 4, 2000

Related U.S. Application Data

(63) Continuation-in-part of application No. 09/505,230, filed on Feb. 16, 2000, which is a continuation-in-part of application No. 09/425,131, filed on Oct. 22, 1999.
(60) Provisional application No. 60/147,319, filed on Aug. 5, 1999.

(51) Int. Cl.[7] ............................................. H01L 31/075
(52) U.S. Cl. ...................................... 257/458; 257/459
(58) Field of Search ............................... 257/452, 457, 257/379, 458, 459, 465, 469

(56) References Cited

U.S. PATENT DOCUMENTS

| | | | | |
|---|---|---|---|---|
| 3,898,686 | A | | 8/1975 | Conradi .......................... 357/30 |
| 4,128,732 | A | * | 12/1978 | Kaplow et al. .......... 136/89 PC |
| 4,625,225 | A | | 11/1986 | Goodfellow et al. ........... 357/30 |
| 4,835,595 | A | | 5/1989 | Oho et al. ....................... 357/30 |

(List continued on next page.)

FOREIGN PATENT DOCUMENTS

JP          402241066 A    *   9/1990

OTHER PUBLICATIONS

Yamamoto et al., "Si–OEIC with a Built–in Pin–Photo-diode", IEEE Transactions On Electron Devices, vol. 42, No. 1, Jan. 1995, pp. 58–63.

(List continued on next page.)

Primary Examiner—Douglas Wille
(74) Attorney, Agent, or Firm—Vernon W. Francissen; Gardner Carton & Douglas LLP

(57) ABSTRACT

A PIN photodiode and method for forming the PIN photodiode are shown where an intrinsic layer of the photodiode can be made arbitrarily thin and a second active region of the photodiode substantially shields a first active region of the photodiode. A fabrication substrate is lightly doped in order to form the intrinsic layer of the photodiode. A void is formed in a first surface of the fabrication substrate and a first active region of the photodiode having a first conductivity type is formed in the void. An oxide layer is also formed upon the first surface of the fabrication substrate. A handling substrate is bonded to the first surface of the fabrication substrate. A second surface of the fabrication substrate is then lapped to a obtain a preselected thickness of the intrinsic layer. A depth of the void is selected such that a portion of the first active region is exposed at the second surface of the fabrication substrate after lapping. A second active region of the photodiode having a second conductivity type is formed on the second surface of the fabrication substrate. The second active region may be formed such that it substantially surrounds the exposed portion of the first active region. A low resistance contact to the exposed portion of the first active region is formed, where the area of contact is small. Also, dummy differential contact can be formed on the topside of the photodiode adjacent to the low resistance contact for use with a differential input receiver circuit. Further, separate second active regions may be formed, with separate contacts and one of the regions covered by an opaque layer, to obtain a differential photodiode.

11 Claims, 12 Drawing Sheets

U.S. PATENT DOCUMENTS

| | | | |
|---|---|---|---|
| 4,847,210 A | 7/1989 | Hwang et al. | 357/30 |
| 5,013,681 A | 5/1991 | Godbey et al. | 437/86 |
| 5,101,253 A | 3/1992 | Mizutani et al. | 357/30 |
| H1137 H | 2/1993 | Easter et al. | 437/62 |
| 5,239,193 A | 8/1993 | Benton et al. | 257/292 |
| 5,344,499 A | 9/1994 | Kanbara et al. | 136/258 |
| 5,360,987 A | 11/1994 | Shibib | 257/446 |
| 5,523,610 A * | 6/1996 | Kudo et al. | 257/443 |
| 5,587,611 A | 12/1996 | Botka et al. | 257/458 |
| 5,598,022 A | 1/1997 | Kyomasu | 257/458 |
| 5,773,352 A | 6/1998 | Hamajima | 438/406 |
| 5,773,355 A | 6/1998 | Inoue et al. | 438/459 |
| 5,801,084 A | 9/1998 | Beasom et al. | 438/457 |
| 5,821,597 A | 10/1998 | Nakajima et al. | 257/458 |
| 6,027,956 A | 2/2000 | Irissou | 438/68 |
| 6,054,751 A * | 4/2000 | Ichikawa et al. | 257/532 |
| 6,075,275 A | 6/2000 | Irissou | 257/458 |

OTHER PUBLICATIONS

Usami et al., *"Evaluation of the Bonded Silicon on Insulator (SOI) Wafer and the Characteristics of PIN Photodiodes on the Bonded SOI Wafer"*, IEEE Transactions On Electron Devices, vol. 42, No. 2, Feb. 1995, pp. 239–243.

Kyomasu et al., *"An Abnormal Phenomenon Due to Substrate Bias Modulation in the Integrated PIN Photodiode Sensor with Dielectric Isolation"*, IEEE, IMTC'94, May 10–12, pp. 238–241.

* cited by examiner

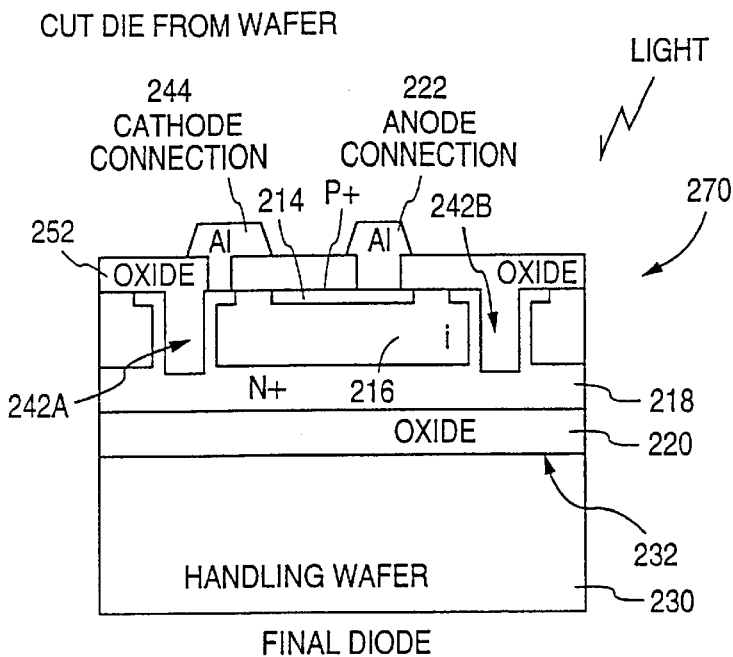
FIG. 2L
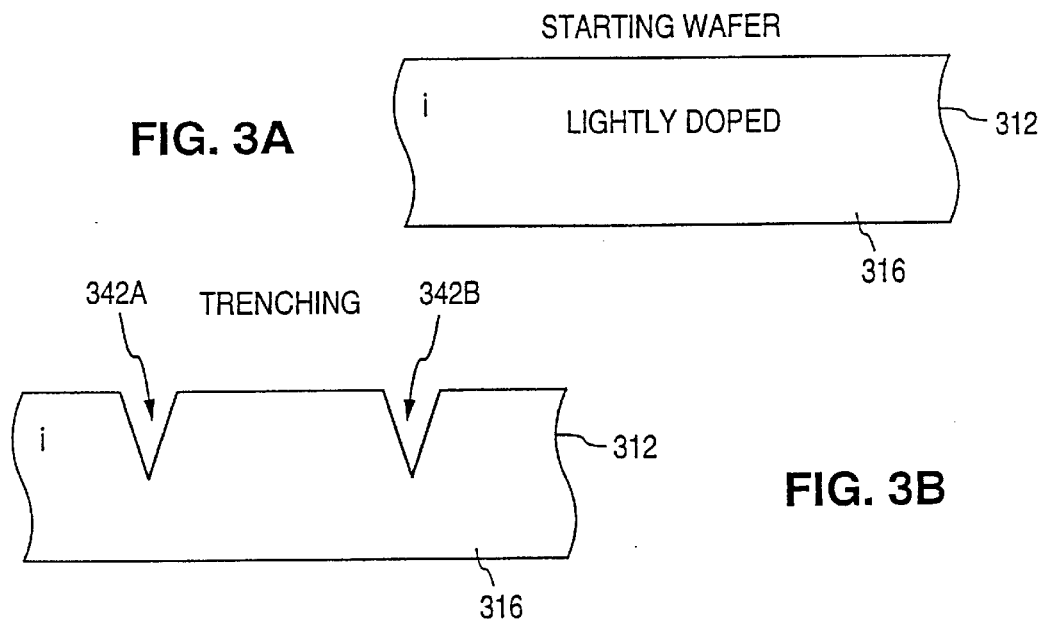
FIG. 3A
FIG. 3B
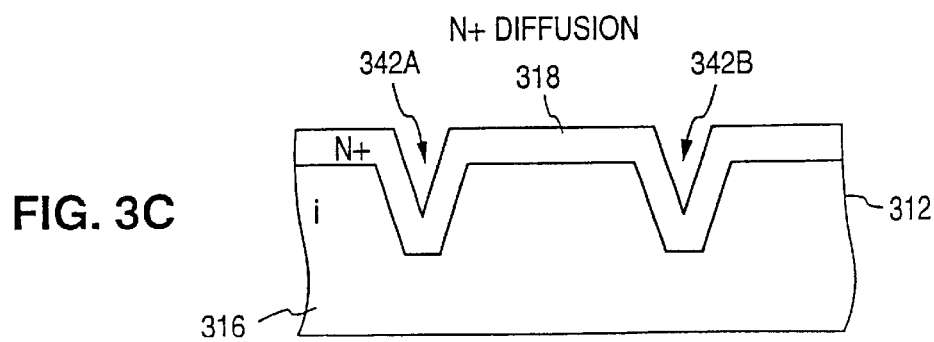
FIG. 3C

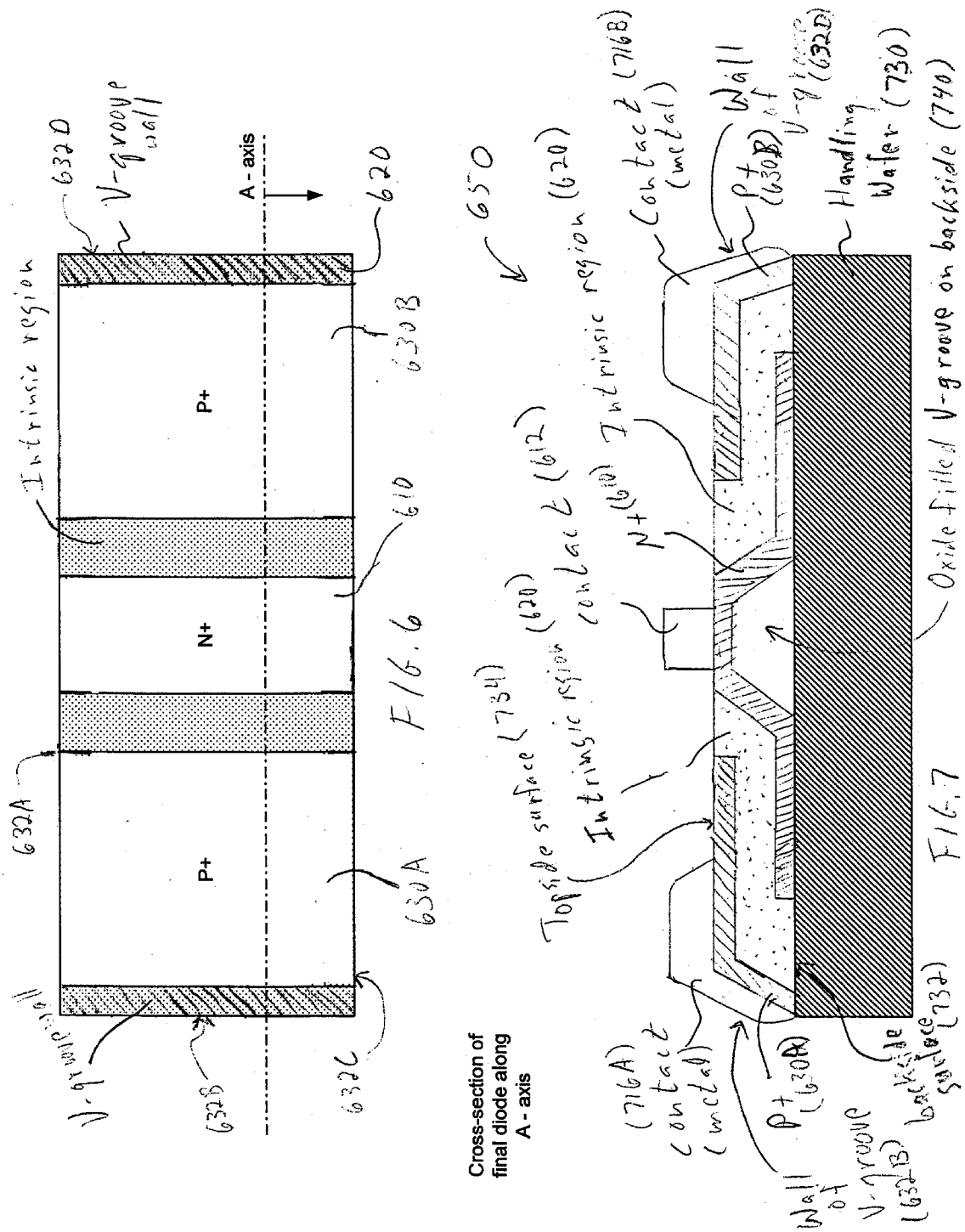

SHIELDED PLANAR DIELECTRICALLY ISOLATED HIGH SPEED PIN PHOTODIODE AND METHOD FOR PRODUCING SAME

This application is a continuation-in-part of U.S. application Ser. No. 09/505,230, co-pending, filed Feb. 16, 2000. This application is also a continuation-in-part of U.S. application Ser. No. 09/425,131, co-pending, filed Oct. 22, 1999. This application further claims the benefit of U.S. Provisional Application Ser. No. 60/147,319, filed Aug. 5, 1999.

BACKGROUND OF THE INVENTION

1. Field of the Invention

The present invention is directed toward an improved photodiode structure.

2. Description of the Related Art

Photodiodes are diodes in which charge carriers are generated responsive to light incident upon the photodiode. Any PN junction diode which admits light can function as a photodiode. A photodiode outputs voltage or current when absorbing light. In a photodiode which is intended for high speed communication systems, it is important to optimize the performance for light conversion efficiency, speed (minimal transit time delay), minimum RC time constant, ability to operate at low reverse bias voltage, and cost in the application in which the photodiode will be employed.

FIG. 1 illustrates the structure of a conventional PIN photodiode 10. A wafer 12 is lightly doped with N dopant in order to produce an intrinsic region 16. A P+ region 14 is formed on one surface of the wafer and an N+ region 18 is formed on the opposing surface of wafer 12 with intrinsic region 16 interposed P+ region 14 and N+ region 18. A reflective layer 20 is disposed on the surface containing N+ region 18 with reflective layer 20 also acting as the electrical contact to N+ region 18. A metal contact ring 22 is disposed on the surface containing P+ region 14 to provide the electrical connection to the P+ region.

Typically, one power supply potential is applied to the reflective layer and another power supply voltage is applied to contact 22 to reverse bias the PN junction formed by P+ region 14 and N+ region 18. This forms a depletion region 17 within the intrinsic region 16 wherein electron and hole charge carrier pairs generated by light photons incident upon the intrinsic region 16 are rapidly accelerated toward the P+ and N+ regions respectively by the electric field of the reverse bias voltage. Charge carrier pairs are also typically generated outside the depletion region 17 in non-depletion regions 24A and 24B of intrinsic region 16 and diffuse, due to random thermal motion of the carriers, at a much slower velocity until they reach either depletion region 17 or the junction formed by P+ region 14 and intrinsic region 16 of photodiode 10.

A conventional photodiode that is designed for high quantum, i.e. light conversion, efficiency requires that the light path within the photo current collection zone, the non-depletion 24 and depletion 17 regions, be sufficient in length so that most of the light photons of the incident light signal are absorbed and converted into electron-hole pairs that are collectable at the P+ and N+ regions. Usually, this requires that the width W2 of the intrinsic region 16, which is the primary collection region between the P+ 14 and N+ 18 regions, be several times the length required for light absorption. If diode 10 has an efficient back-side reflector, such as reflective layer 20, which effectively doubles the light path within diode 10, then the intrinsic region 16 of the photodiode can be made narrower. For a typical near infrared silicon photodiode, the nominal absorption path length is about 15–25 microns. The path length should be at least two to three times the nominal absorption path length to obtain good light conversion efficiency.

On the other hand, a photodiode designed for high frequency response requires that the photo current pairs generated by the light signal be collected rapidly and that the diode RC time constant is fast. Rapid photo current pair collection usually requires that most of the photo current pairs generated by the light signal be generated within the depletion region 17 which has a high drift velocity when reversed biased. Otherwise, the photo generated charge carrier pairs produced in the non-depletion regions 24A and 24B outside the depletion region 17, but within the diffusion distance of the collection electrodes 14 and 18, will have a diffusion velocity which is several hundred times slower than the velocity of the pairs generated within the depletion region 17. The photo generated charge carrier pairs in non-depletion regions 24A and 24B will slowly migrate for collection at P+ region 14 and N+ region 18 resulting in a tail on the trailing edge of the electrical signal corresponding to the light signal. The diffusion distance of the charge carriers is determined by the carrier mean free path before re-combination and may exceed 150 microns.

A fast RC time constant for photodiode 10 requires minimal capacitance and low series resistance between the electrical contacts 20 and 22 and the photo current pair collection sites at the margin between the depletion region 17 and P+ region 14 and the margin between depletion region 17 and N+ region 18. The greater the width W2 of the depletion layer 16, then the lower will be the capacitance per unit area of photodiode 10. Since the depletion width of the depletion region formed between P+ region 14 and N+ region 18 increases with the level of the reverse bias voltage, it is typical for high speed photodiodes to have a relatively high reverse voltage applied to them.

The inclusion of the separate lightly doped intrinsic region 16 between the P+ and N+ regions 14 and 18 results in a PIN diode with a wider depletion region 17, depending on reverse bias voltage, which improves the light collection efficiency, speed, and reduces capacitance over that of a simple PN photodiode structure. Tailoring the width of the intrinsic region 16 allows for enhanced performance and tradeoffs for photodiode light conversion efficiency, response speed, and capacitance.

For example, a near infrared photodiode intended for use in a high speed, low cost IrDA data receiver operating from a 2.7V–5V power supply should ideally have an intrinsic layer width W2 of about 20–40 microns wide to allow for good light absorption efficiency and to allow for full depletion of the intrinsic region 16 with a low 1–3V reverse bias, since typically not all of the power supply voltage is available for reverse bias. Such a diode will achieve minimal transit delay, less than 1 nanoseconds (ns), a minimal RC time constant, and optimal high current frequency response with low resistance in the intrinsic region 16.

Although a PIN photodiode outperforms a standard PN diode, it cannot be easily manufactured by standard semiconductor processes wherein fabrication is typically performed on only one side of the semiconductor wafer 12.

A PIN photodiode is typically produced by diffusing the N+ diffusion region 18 on the back side of the lightly doped (N) wafer 12, diffusing the P+ diffusion region 14 on the topside of wafer 12, and then adding metal contacts to each side of the wafer. Typically, the backside contact area connected to N+ region 18 is reflective layer 20 and is made of gold. The topside contact area 22 is an aluminum collector ring that is connected to P+ diffusion region 14. The intrinsic or depletion layer depth W2 is determined by the wafer starting thickness W1 less the thickness of the N+ 18 and P+ 14 diffusion regions. Since standard silicon wafers are 350–500 microns in thickness and N+ and P+ diffusions are only a few microns thick, this typically results in an intrinsic layer width W2 of 345–495 microns.

An improvement to the PIN manufacturing process described above is to lap the width W1 of the starting wafer 12 to as thin as 100 microns, which will reduce the intrinsic layer width W2 to about 95 microns. However, it is generally not practical to thin wafers beyond this limit without an excessive level of wafer breakage along with severe wafer handling and processing problems.

A PIN diode with an intrinsic region width W2 of 95 microns typically requires more than a 5V reverse bias to be applied to the P+ and N+ regions 14 and 18 in order to completely deplete the intrinsic region 16 and achieve optimal frequency response for the photodiode. Consequently, the use of such a PIN photodiode in a high speed data receiver operating from a standard power supply voltage level of 2.7V–5V results in degraded speed performance.

Another problem with the structure of PIN diode 10 is that the connection of reflective layer 20 on the backside of wafer 12 requires the conductive bonding of the die of photodiode to a conductive substrate which may not be at the desired power supply potential or may not be a convenient electrical connection in the receiver design. In addition, if this conductive substrate is the active output of a photodiode it may undesirably act as an antenna for noise pickup.

Another method which has been attempted to produce a low cost PIN diode is to grow an epitaxial intrinsic layer on top of an N+ or P+ diffusion. However, because such an epitaxial layer is grown at high temperature it has high auto-doping levels due to the diffusion of the dopants of the underlying diffusion region which consequently prevents the formation of a lightly doped intrinsic layer 16.

Another method for producing a PIN diode 10 that is more successful is to grow an insulating oxide layer on top of the N+ or P+ diffusion and then to grow a thick polysilicon layer of several hundred microns to act as a handling layer so that the wafer 12 may be lapped as thin as needed to obtain the desired intrinsic region width W2. Following the lapping operation, the PIN diode can be processed in the standard way. Although this method is proven effective, growing a thick polysilicon layer is an expensive processing step.

One problem with the structure of PIN photodiode 10 is that the junction between the P+ region 14 and intrinsic region 16 does not extend to the edge of the photodiode. This is done in order to prevent shorting of the junction to the intrinsic region when cutting wafer 12 to obtain the individual die for each photodiode. Consequently, the depletion region 17 produced by the reverse bias voltage does not fully extend to the edge of the die resulting in non-depletion regions 24A and 24B at the edge of photodiode 10 which can be significant sources of slow diffusing photo generated carriers. A metal light guard ring is typically placed over the edge region of photodiode 10 to minimize generation of carriers in drift regions 24A and 24B, but this does not fully suppress the formation of slow carriers.

Another problem arising from the fact that the P+ region does not extend around the edges is that in a typical application where the P+ region is grounded or tied to an AC ground, and where the N contact is the active input to a receiver, the N edge around the periphery of the diode acts undesirably as an antenna for noise pickup. Although the noise pickup from the bond wire between the receiver input and the photodiode active output can be mitigated by use of another bond wire parallel to the first between a receiver differential input and a dummy connection on the photodiode, such a differential technique does not cancel the noise pickup from the unshielded photodiode periphery.

To address noise pickup, a differential antenna can be constructed that has the same noise pickup as the photodiode periphery, where the differential antenna can be used to cancel the noise pickup. However, in practice, due to lack of pickup symmetry, such a dummy differential antenna has very limited and highly variable efficacy. For instance, IBM produces a 4 Mbit IrDA receiver device using a conventional PIN photodiode and a differential input receiver circuit. In this device, the PIN photodiode is mounted on an isolation plate that is physically designed, in terms of physical dimensions and component layout, to tune the isolation plate to make the noise pickup of the N and P regions of the photodiode approximately the same for electrostatic fields emanating from in front of the receiver device. Unfortunately, the electrostatic fields tend to be asymmetric resulting in high electrostatic field side pickup. Even in terms of electrostatic field front pickup, the noise immunity of this approach is typically only about 12 dB better than a PIN photodiode combined with a single-ended receiver circuit.

Also, it is difficult to employ a differential receiver technique with a standard PIN photodiode using low cost packaging technology because of the need to create a dummy differential antenna with the same pickup level as the active input lead. Lead frame packaging technology is low cost, but it is necessary to to add an internal isolation plate mounted onto the lead frame which increases the production costs for the resulting part. Another approach, known as the cast process, uses a printed circuit board to mount the components for the receiver or transceiver device and the dummy differential antenna is formed on the printed circuit board. However, the cast process is also somewhat expensive, though it may be the only viable packaging technique for receiver or transceiver circuits that are too small for lead frame technology.

Accordingly, it is an object of the present invention to reliably produce a high-speed low-cost PIN photodiode that can operate at low operating voltages.

SUMMARY OF PRESENT INVENTION

Some of the problems with the prior art may be overcome through the following embodiments of the present invention.

An embodiment of a method for fabricating a PIN photodiode, according to the present invention, includes providing a first semiconductor substrate lightly doped with one of first and second dopant types, the first semiconductor substrate having first and second planar surfaces. The method also includes forming a first void in the first planar surface of the first semiconductor substrate, the first void having walls that intersect the first planar surface, and diffusing the walls of the first void with the first dopant type to form a first active region. The method also calls for forming a first oxide layer on the first planar surface of the first semiconductor substrate, bonding a first surface of a second semiconductor substrate to the first planar surface of the first semiconductor substrate, and lapping the second planar surface of the first semiconductor substrate to expose a portion of the first active region. The method also sets forth selectively masking and diffusing a predetermined portion of the second planar surface of the first semiconductor substrate with a second dopant type to form a second active region, forming a first contact adjacent to the exposed portion of the first active region, and forming a second contact adjacent to at least a portion of the second active region. Further refinements of this embodiment of the method according to the present invention call for selecting the predetermined portion of the second planar surface such that the second active region substantially surrounds the first active region and forming the second contact along substantially all of a periphery of the second active region. Still another refinements sets forth selectively masking and forming an insulating layer pattern on a portion of the second planar surface separate from the first contact and adjacent to the first contact, and forming a third contact on the insulating layer pattern.

A further refinement to the method according to the present invention calls for the step of selectively masking and diffusing a predetermined portion of the second planar surface of the first semiconductor substrate with the second dopant type to form a second active region to further include diffusing first and second predetermined portions of the second planar surface of the first semiconductor substrate with the second dopant type. The step of forming a second contact adjacent to at least a portion of the second active region is further refined to set forth forming the second contact adjacent the first predetermined portion of the second planar surface and forming a third contact adjacent to the second predetermined portion of the second planar surface. The method then includes the step of forming an opaque layer over the second predetermined portion of the second planar surface.

An embodiment of another method for producing a PIN diode, according to the present inventions, provides for lightly doping a first semiconductor substrate with one of first and second dopant types, the first semiconductor substrate having first and second planar surfaces, forming a void on the first surface of the first semiconductor substrate, the void having walls that intersect the first planar surface, and diffusing the walls of the void with the first dopant type to form a first active region. The method further recites forming a first oxide layer on the first surface of the first semiconductor substrate, bonding a first surface of a second semiconductor substrate to the first planar surface of the first semiconductor substrate, and lapping the second planar surface of the first semiconductor substrate to form an intrinsic region of a predetermined thickness. The method also calls for diffusing the second dopant type into a first selected portion of the second planar surface of the first semiconductor substrate to form a second active region, forming a first contact electrically coupled to the first active region, and forming a second contact electrically coupled to the second active region. One further refinement of this embodiment of the invention call for selecting the first selected portion of the second planar surface such that the second active region surrounds a portion of the first active region exposed through the second planar surface of the first semiconductor substrate. Still further refinements to this embodiment call for etching a periphery of the first selected portion of the second planar surface to form walls of the periphery, diffusing the second dopant type into the walls of the periphery, and forming the second contact along the walls of the periphery.

An embodiment of PIN photodiode, according to the present invention, includes a first semiconductor substrate having first and second planar surfaces, the first semiconductor substrate being composed of intrinsic material and having formed therein a void having walls intersecting the first planar surface. A first active region is disposed along the void and intersecting a first portion of the second planar surface of the first semiconductor substrate, the first active region having a first dopant type. A second active region is disposed within the first semiconductor substrate adjacent to a second portion of the second planar surface of the first semiconductor substrate, where the second active region is spaced apart from the first active region so as to form an intrinsic region interposed the first and second active regions, the second active region having a second dopant type. A first contact is disposed within at least part of the first portion of the second planar surface and electrically coupled to the first active region and a second contact is disposed within at least part of the second portion of the second planar surface and electrically coupled to the second active region. In another embodiment of a photodiode according to the present invention, the second portion of the second planar surface of the first semiconductor substrate substantially surrounds the first portion of the second planar surface. In still another embodiment of a photodiode according to the present invention, the photodiode includes sidewalls formed along a periphery of the second portion of the second planar surface and intersecting the first and second planar surfaces, the sidewalls being diffused with the second dopant type such that the sidewalls function as part of the second active region. In further refinements, the second contact is disposed along the sidewalls and the void is filled with an insulating material. In yet another refinement, the photodiode includes a third contact disposed substantially adjacent to the first contact and electrically isolated from the first and second active regions and the intrinsic region. And in yet another refinement to the PIN photodiode of the present invention, the first active region is further disposed along a portion of the first planar surface of the semiconductor substrate adjacent to the void and intersecting the walls of the void, and a portion of the second active region overlaps at least part of the first active region disposed along the portion of the first planar surface of the semiconductor substrate adjacent to the void.

BRIEF DESCRIPTION OF THE DRAWINGS

FIGS. 2A–L illustrate a series of steps for an embodiment of a process for producing a planar PIN photodiode.

FIGS. 3A–L illustrate a series of steps for another embodiment of a process for producing a planar PIN photodiode.

FIG. 6 is a diagram illustrating an overhead view of diffusion areas for another embodiment of a photodiode according to the present invention.

FIG. 7 is a cross-sectional view of an embodiment of a shielded photodiode according to the present invention having the diffusion area shown in FIG. 6.

DETAILED DESCRIPTION OF THE PRESENT INVENTION

The present invention describes an improved photodiode structure having a low resistance contact to a first doped region, where the area of contact is small and where the photodiode is shielded by a conductive contact to a second doped region. The first doped region is formed on the backside of a first wafer having a first V-groove or trench etched into it. A second wafer is attached to the backside of the first wafer and the first wafer is lapped to a desired thickness. The first V-groove or trench is formed such that the first doped region reaches through to the topside of the first wafer after lapping. A second V-groove or trench is formed on the topside of the first wafer and a second doped region is formed on this V-groove or trench and on a portion of the topside such that the first and second doped regions are isolated from one another. A first contact is formed on the topside where the first doped region is present. A second contact is formed on the topside adjacent to part of the second doped region that is adjacent the second V-groove or trench so as to shield the photodiode. A dummy differential contact can be formed on the topside of the photodiode for use with a differential input receiver circuit.

FIGS. 2A–L describe an improved PIN photodiode fabrication method which utilizes a standard thickness handling wafer with an isolating oxide layer grown on its surface that is bonded to the $N^+$ diffusion side of a fabrication wafer. The handling wafer allows the intrinsic region of the fabrication wafer to be lapped to a thin thickness, as required for optimum performance of the PIN photodiode, while the handling wafer provides mechanical rigidity needed for processing. $N^+$ and $P^+$ regions are then diffused into the fabrication wafer. Next, diode trenches are etched around the periphery of each photodiode down to the N+ region. The sidewalls of the trenches are then N+ diffused before being covered with an oxide layer and then filled with polysilicon. Finally, coplanar metal contacts to the N+ and P+ regions are formed.

Figure 1:
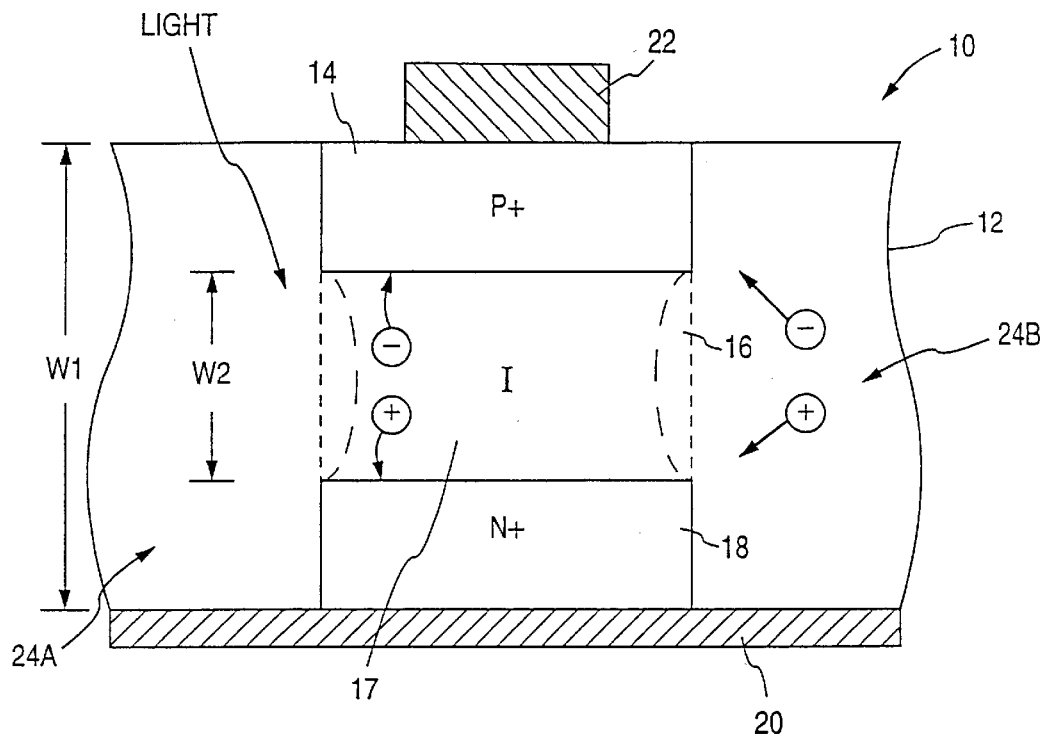
FIG. 1 describes the structure of a conventional PIN photodiode.
Figure 2A:
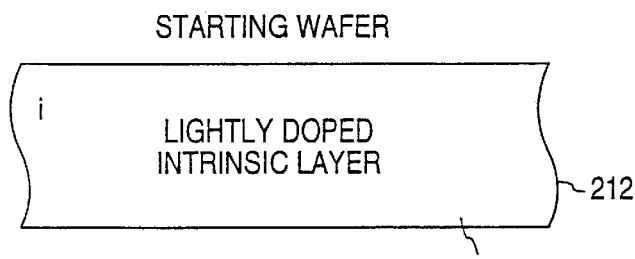
Figure 2B:
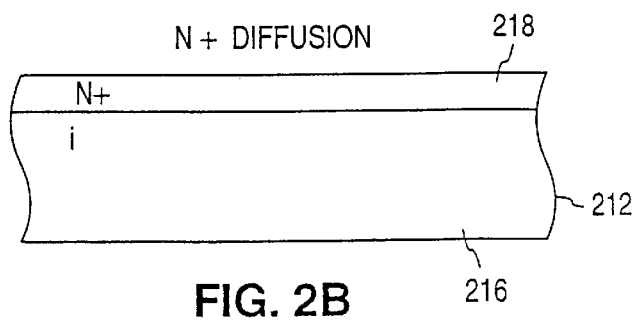

The process begins with fabrication wafer 212 of FIG. 2A, which is lightly N doped to form an intrinsic layer 216 which will later become the intrinsic region of a PIN diode. An N+ diffusion layer 218 is then formed on fabrication wafer 212, as shown in FIG. 2B.

Figure 2C:
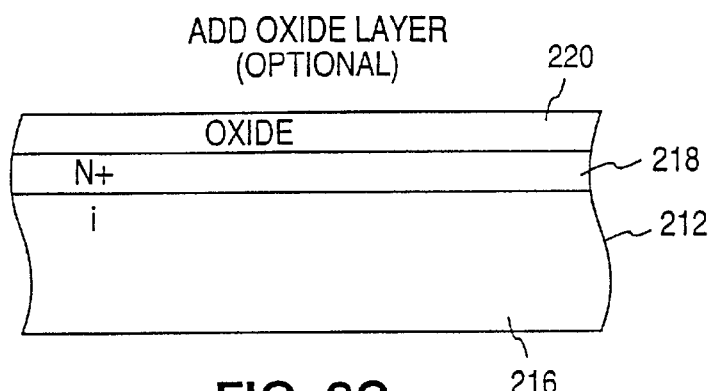

Optionally, an oxide layer 220 can be formed on the N+ layer 218 on fabrication wafer 212 in order to form a dielectric interference reflector which improves the light absorption efficiency of the PIN photodiode, as shown in FIG. 2C. Alternatively, the dielectric interference reflector can be formed by producing an oxide layer on the handling wafer 230.

Figure 2D:
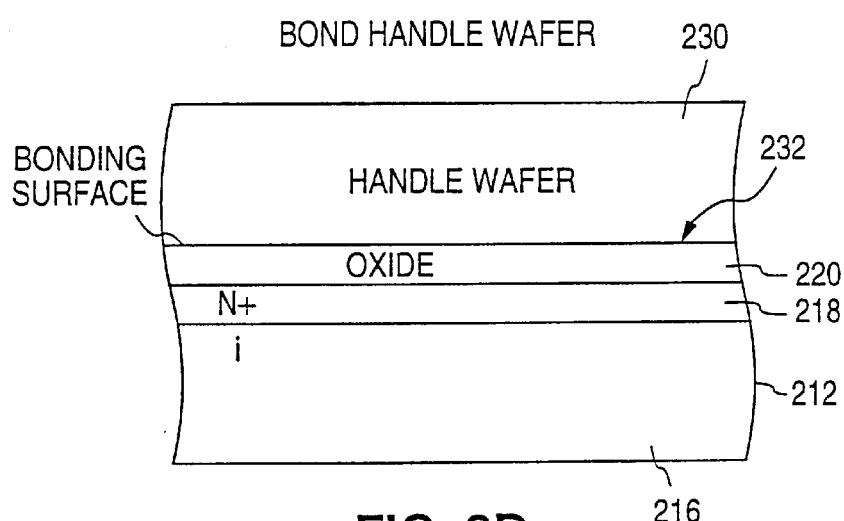

A handling wafer 230 is then bonded to a surface 232 of fabrication wafer 212 that includes the N+ diffusion 218, as shown in FIG. 2D. Bonding is accomplished by polishing the opposing faces of the handling wafer 230 and fabrication wafer 212 to a fine level of planarity. When the resulting highly planar surfaces of the handling wafer 230 and fabrication wafer 212 are subsequently pressed together, the polished surfaces will bind, to some degree, to one another through Van der Waal's cohesive forces. The handling wafer 230 and fabrication wafer 212 will become further bonded during the heating steps associated with subsequent processing steps, such as during the diffusion of dopants. The oxide layer 220 becomes important during these subsequent heating cycles as a barrier between the N+ diffusion 218 and the contaminants present in handling wafer 230. Also, it is important that the handling wafer 230 and fabrication wafer 212 have the same coefficient of thermal expansion to prevent warping or separation of the two wafers during the subsequent heating cycles.

Figure 2E:
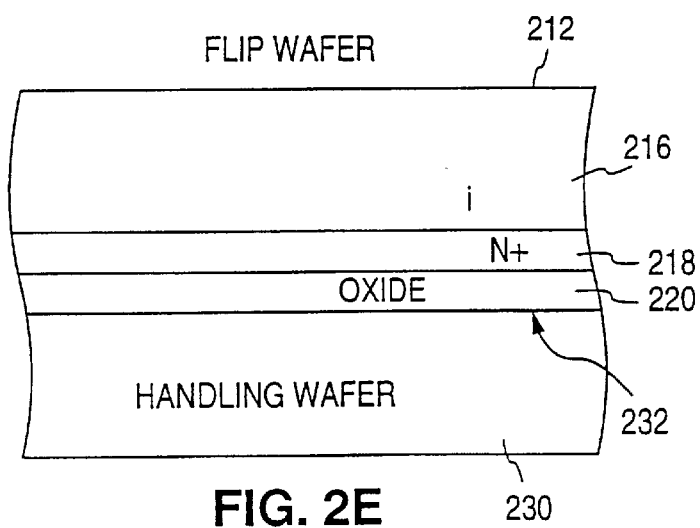
Figure 2F:
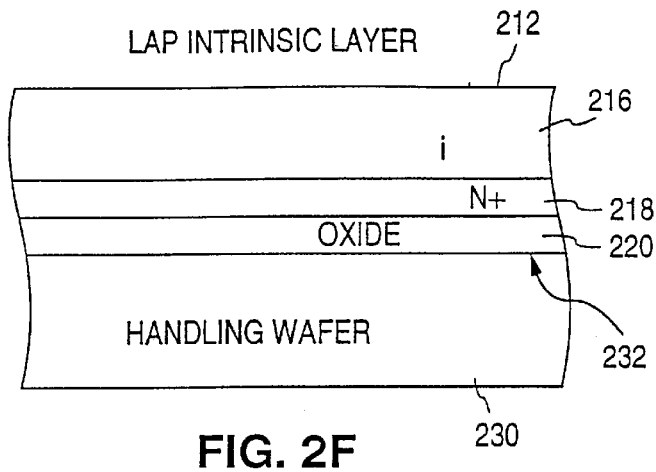
Figure 2G:
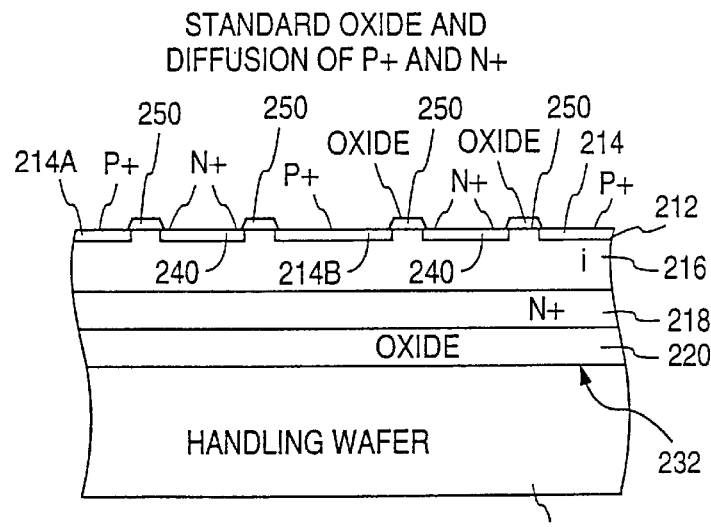

The structure formed by the fabrication wafer 212 bonded to the handling wafer 230 is then flipped, as shown in FIG. 2E, so that further fabrication processing can be performed on fabrication wafer 212. The intrinsic layer 216 can then be lapped to the desired thickness for optimal performance of the PIN diode by lapping fabrication wafer 212. In the process of the present invention, the thickness of intrinsic layer 216 is not constrained by requirements for mechanical integrity of the fabrication wafer 212 needed for subsequent processing steps, as is the conventional PIN photodiode and process. The handling wafer 230 provides the mechanical integrity needed for the handling required for further processing of the fabrication wafer 212 while the intrinsic layer 216 can be lapped to the optimal thickness for the operation of the PIN photodiode.

After the intrinsic layer 216 is lapped, P+ regions 214 are diffused into fabrication wafer 212 along with N+ regions 240. Oxide regions 250 are fabricated between P+ regions 214 and N+ regions 240 with the resulting structure shown in FIG. 2G.

Figure 2H:
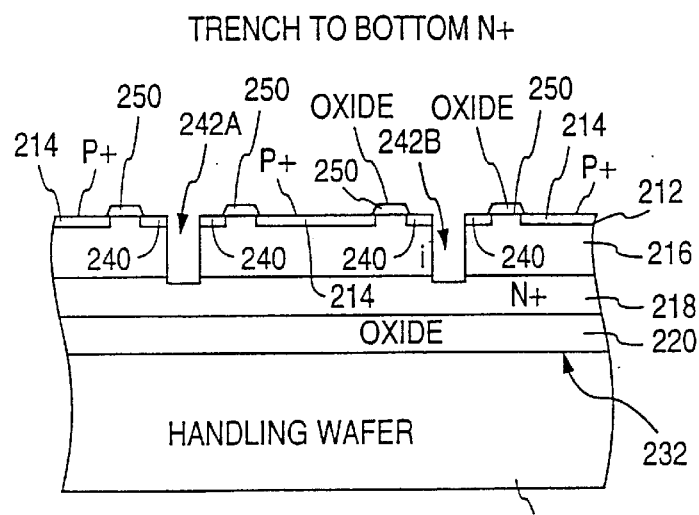
Figure 2I:
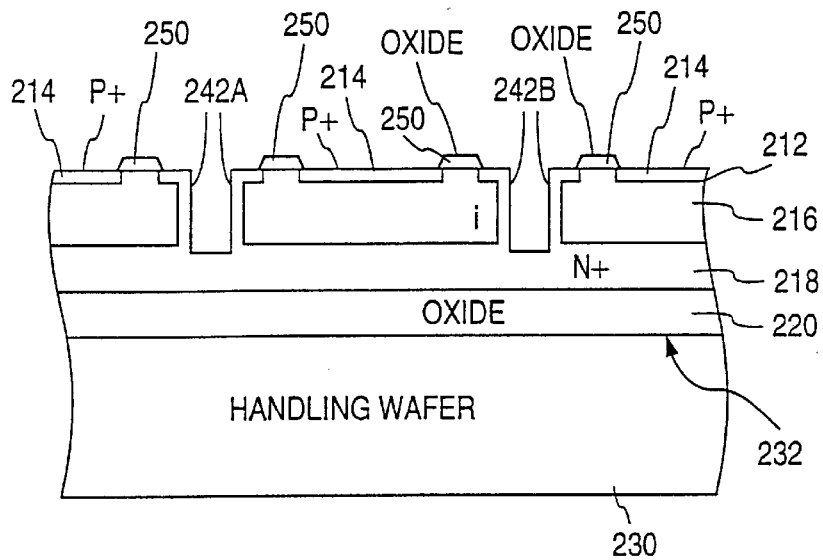
Figure 2J:
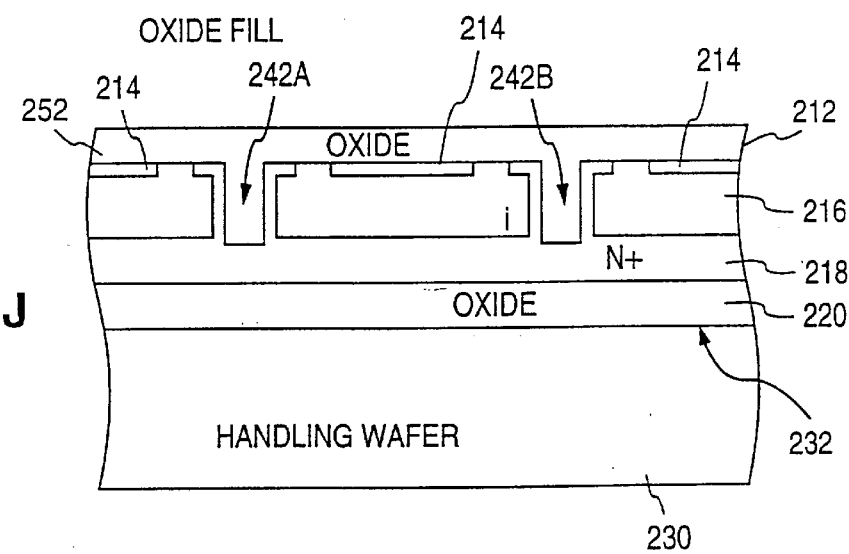

Isolation trenches 242A and 242B are then formed in N+ regions 240 and intrinsic layer 216 down to N+ layer 218, as shown in FIG. 2H. The sidewalls of trenches 242A and 242B are then N+ diffused to form a contiguous N+ region from layer 218 through trenches 242A and 242B to the surface of fabrication wafer 212, as shown in FIG. 2I. An oxide fill is then performed on fabrication wafer 212 that forms an oxide layer 252 that fills trenches 242A and 242B and covers the P+ regions 214 with the resulting structure shown in FIG. 2J.

Figure 2K:
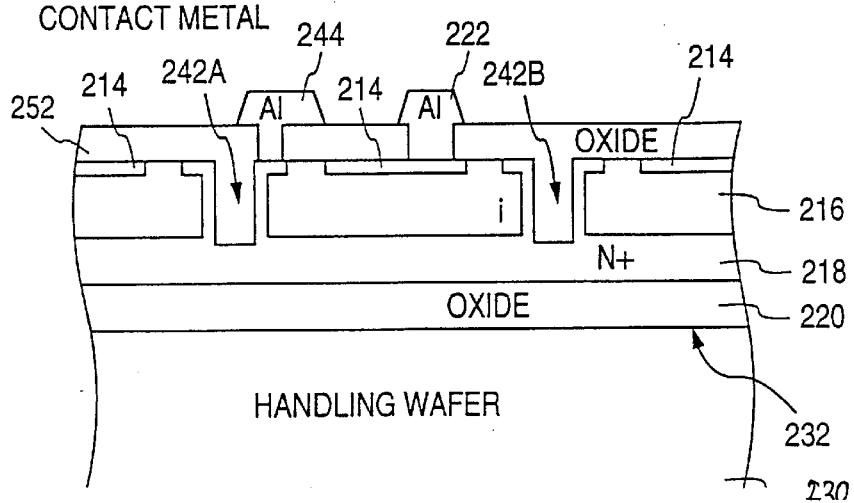

As shown in FIG. 2K, oxide layer 252 is then etched in the area of the N+ wall of trench 242A and the P+ region 214. Contact metal is added to these etched areas to form the cathode contact 244 to N+ layer 216 via trench 242A and the anode contact 222 to P+ region 216. The semiconductor die are then cut from fabrication wafer 212 and handling wafer 230 to form the individual PIN photodiode 270 shown in FIG. 2L.

The resulting PIN photodiode 270 has a thinner intrinsic region 216 than can be obtained with conventional processes so that the thinner depletion region formed in the diode by lower reverse bias voltage levels will still permit high speed operation. In addition, isolation trenches 242A and 242B isolate the P+ region 214 and N+ region 218 of photodiode 270 from photo generated charge carrier pairs formed outside of intrinsic region 216, which again allows for higher speed operation of the photodiode.

Furthermore, photodiode 270 can be formed using standard semiconductor fabrication processes, rather than photodiode specific processes. And cathode contact 244 and anode connection 222 are coplanar, which allows for standard same-side bonding methods to be used to connect the photodiode to a receiver circuit and allows for additional flexibility in the polarity of the power connections to the photodiode.

FIGS. 3A–L illustrate a process for forming another PIN photodiode according to the present invention. In the process of FIGS. 3A–L, V-grooves are etched in a lightly doped fabrication wafer and then an N+ diffusion is performed around the periphery of what will ultimately become the photodiode. The N+ diffusion is overlaid with an oxide layer and the V-grooves are filled with polysilicon. The fabrication wafer is then polished and bonded to a handling wafer that provides mechanical strength. The intrinsic layer formed in the fabrication wafer can then be lapped to the thickness desired for optimal performance of the photodiode while the handling wafer provides the mechanical support for further processing of the fabrication wafer into a finished photodiode.

Figure 3D:
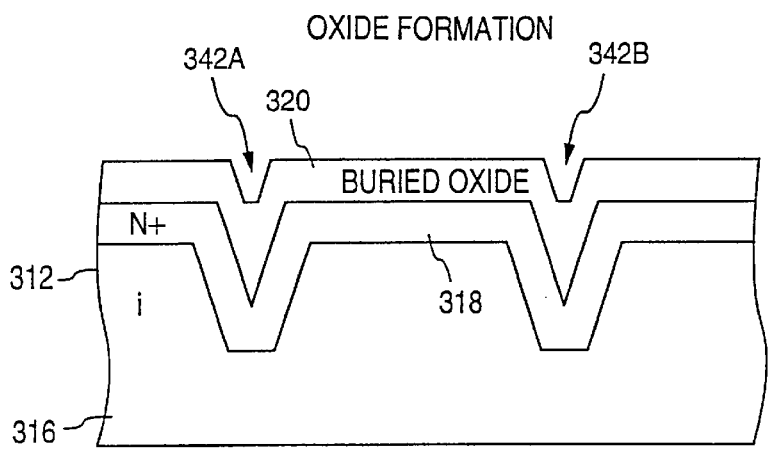

FIG. 3A shows a fabrication wafer 312 that is lightly N doped to form intrinsic layer 316. Fabrication wafer 312 is then etched to form V-grooves 342A and 342B, as shown in FIG. 3B. An N+ region 318 is then diffused into the etched surface of fabrication wafer 312 including the sidewalls of V-grooves 342A and 342B, as shown in FIG. 3C. A field oxide layer 320 is then formed upon fabrication wafer 312 which covers the N+ region 318 and fills V-grooves 342A and 342b with the resulting structure shown in FIG. 3D. Optionally, the thickness of field oxide layer 320 can be controlled so as to form a dielectric interference reflector for improved light absorption efficiency of the resulting photodiode.

Figure 3E:
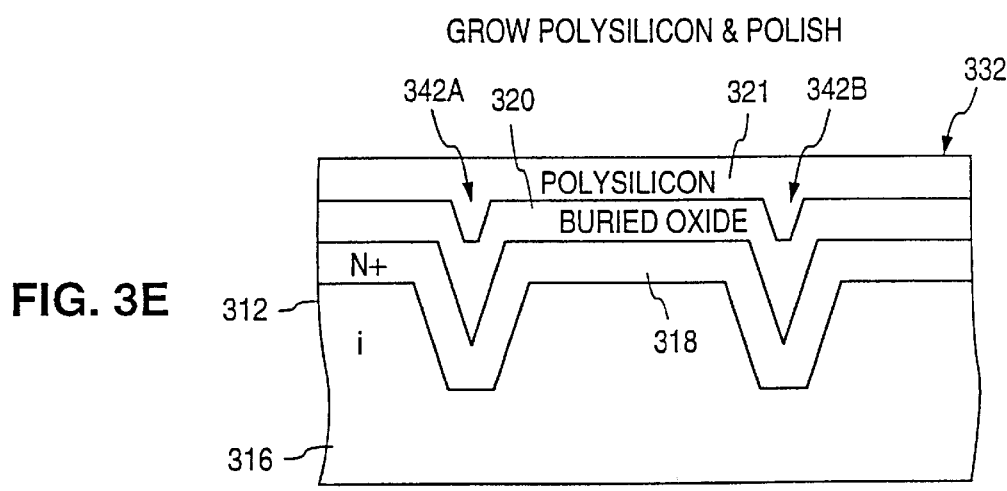
Figure 3F:
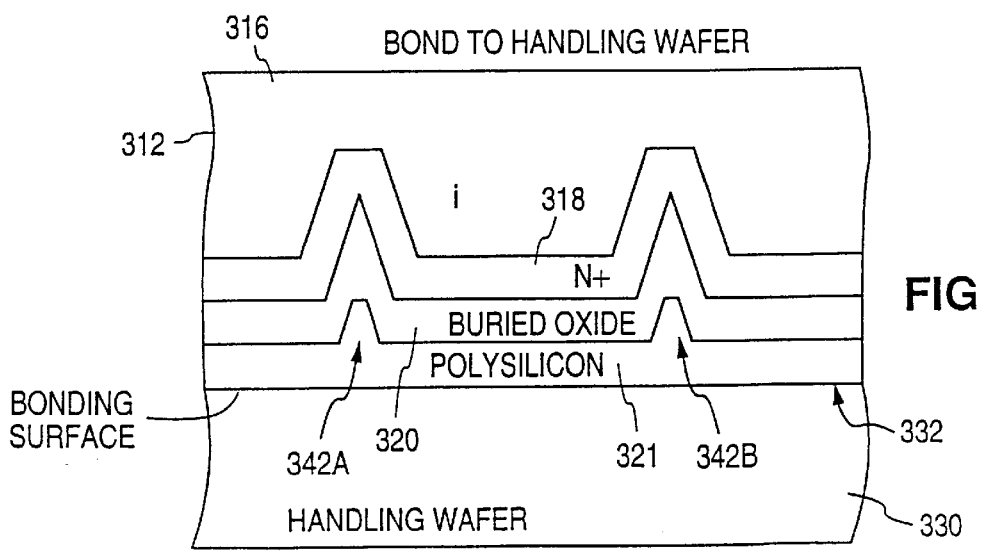
Figure 3G:
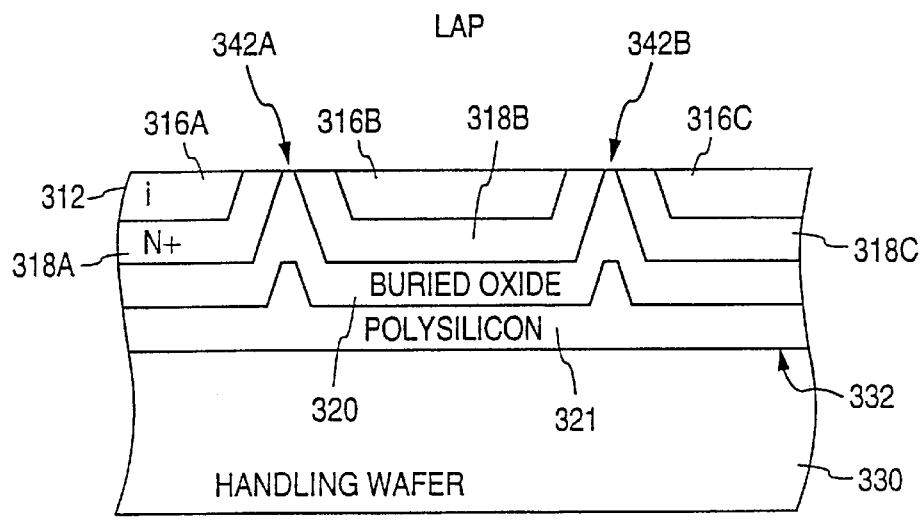

A polysilicon layer 321 is formed upon the field oxide layer 320. A surface 332 of the polysilicon layer is polished and fabrication wafer 312 is flipped, as shown in FIG. 3E. A handling wafer 330 is then bonded to the fabrication wafer at surface 332 to obtain the structure shown in FIG. 3F.

The polysilicon layer 321 has a thermal coefficient which is the same or approximately the same as the thermal coefficient of the silicon of fabrication wafer 312 and handling wafer 330. The thermal coefficient of the buried field oxide layer 320 is significantly different from the thermal coefficient of silicon. The oxide layer 320 is therefore kept thin, approximately 2 microns or less, and the polysilicon layer 321 is formed to prevent cracking of the fabrication wafer 312 as the fabrication wafer and handling wafer 330 are subjected to heating and cooling cycles during further processing.

The intrinsic region 316 of fabrication wafer 312 can now be lapped to the desired thickness, in order to obtain the desired characteristics from the photodiode that is ultimately produced by this process, because handling wafer 330 provides the mechanical support required for the further handling needed to complete the fabrication process on the photodiode of fabrication wafer 312. Lapping fabrication wafer 312 results in the structure shown in FIG. 3G. Note that V-grooves 342A and 342B are of sufficient depth that, after lapping, the grooves reach the lapped surface and field oxide layer 320 isolates the N+ region 318 of each diode from the N+ region of other diodes. Thus, separate intrinsic regions 316A–C and N+ regions 318A–C are formed for each photodiode produced by the process and each photodiode is dielectrically isolated.

Figure 3H:
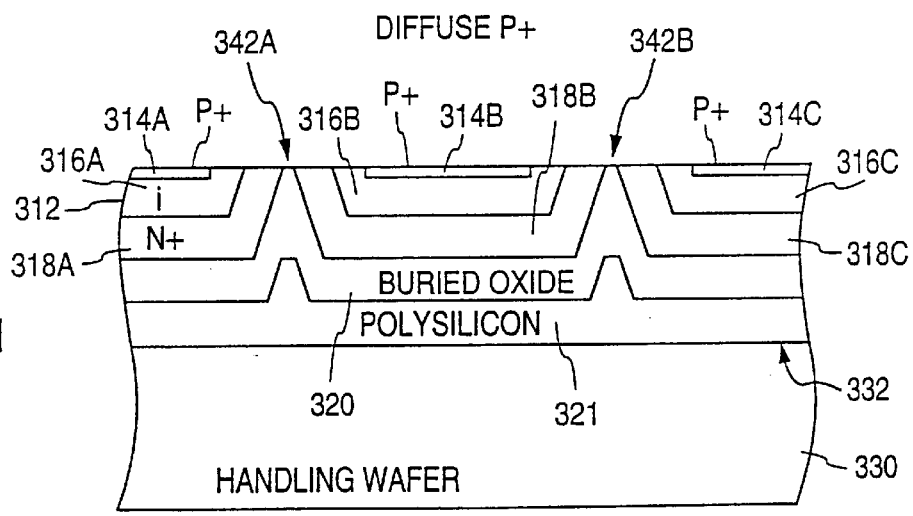
Figure 3I:
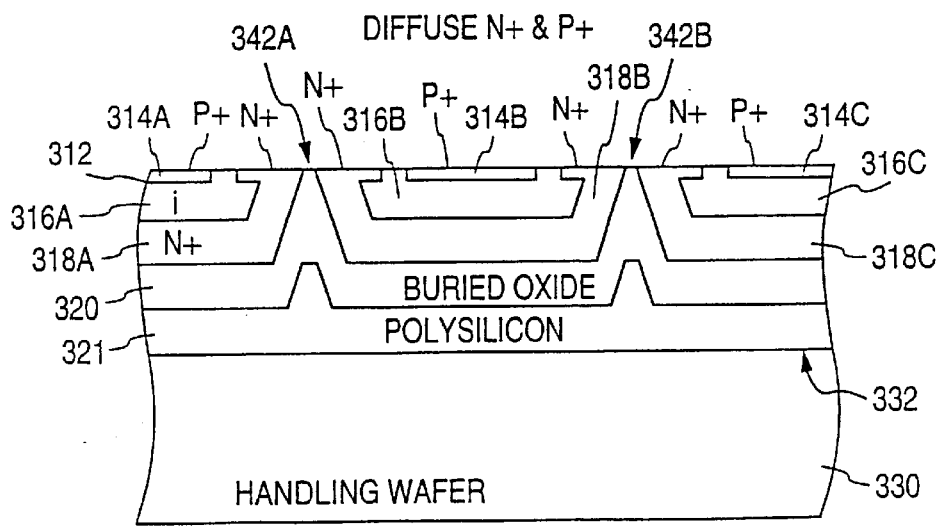
Figure 3J:
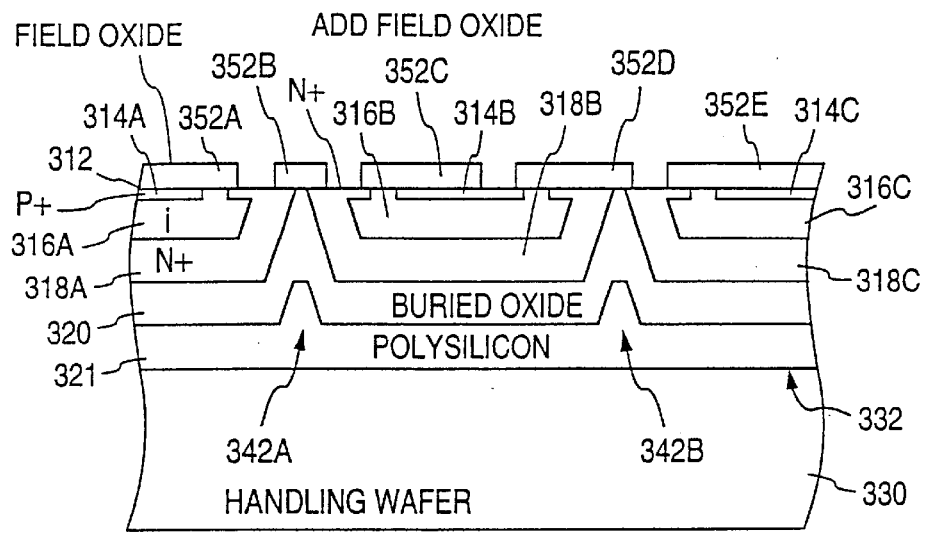
Figure 3K:
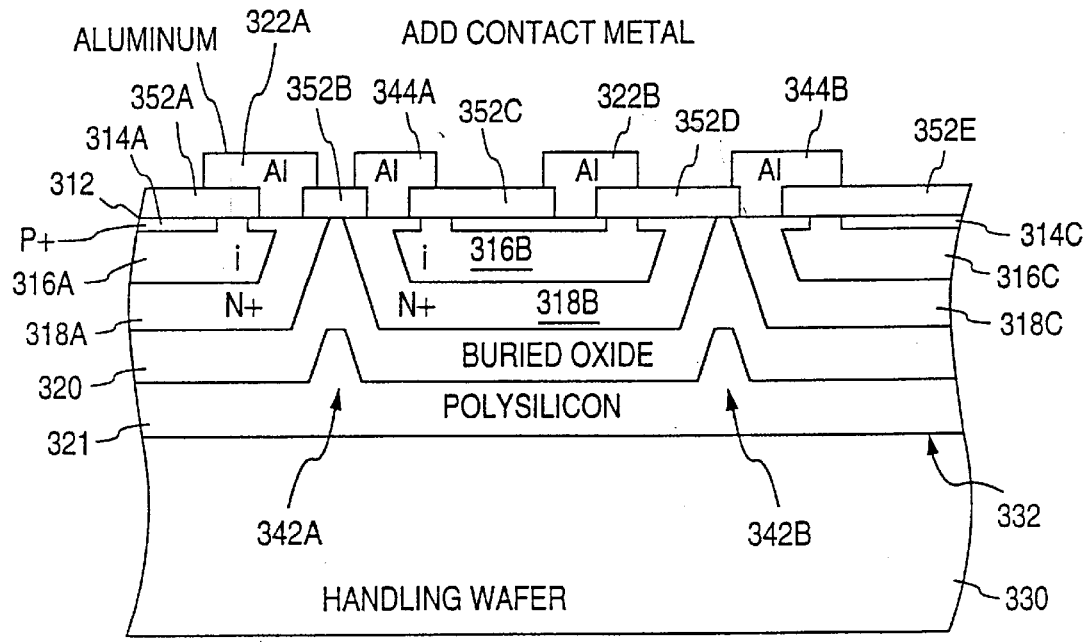

P+ regions 314A, 314B and 314C are then diffused into fabrication wafer 312 to form the PIN structure of the photodiodes, as shown in FIG. 3H. The N+ regions 318A–C are then further extended on the surface of fabrication wafer 312 by N+ diffusing additional surface contact area, as shown in FIG. 3I. Regions of field oxide 352A–E are then formed on the surface of fabrication wafer 312 where the regions of field oxide 352A–E leave contact openings to P+ regions 314A–C and N+ regions 318A–C, as shown in FIG. 3J. Contact metal is then added in the contact openings formed by the regions of field oxide 352A–E to form contacts 322A and 322B to P+ regions 314A and 314B, respectively, as well as contacts 344A and 344B to N+ regions 318B and 318C, respectively, as shown in FIG. 3K. Contacts will be formed to all the photodiodes formed on fabrication wafer 312, even though only a subset of the total number of photodiodes is illustrated in the drawings.

Figure 3L:
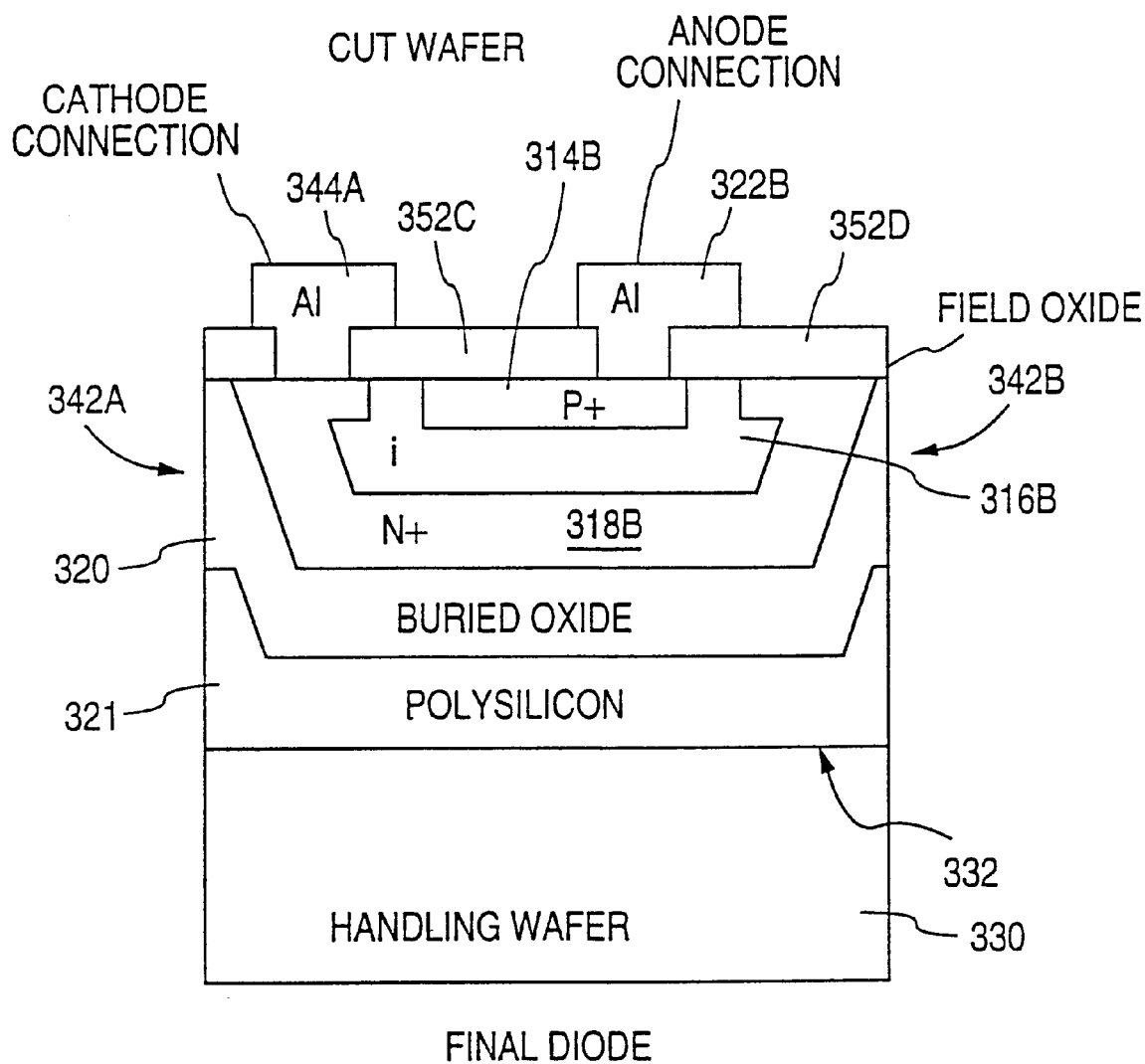

Finally, fabrication wafer 312 and handling wafer 330 are diced to obtain the individual photodiode die. A resulting individual photodiode die is shown in FIG. 3L.

The processing method described above has several advantages over conventional processing techniques. One advantage is that the rigidity of the handling wafer 330 allows the fabrication wafer 312 to be lapped as thin as desired such that the intrinsic region 318 of the resulting PIN photodiode obtains optimum performance without the danger of breakage during further processing due to the thin nature of the fabrication wafer. Another advantage is that V-grooves 342A and 342B allow planar topside connections for the anode 322B and cathode 344A of the PIN photodiode which avoids the necessity of conductive die bonding for the backside diode connection experienced with conventional PIN photodiodes. Furthermore, the V-grooves isolate the depleted active region, formed in intrinsic region 316B when the photodiode is reverse biased, from the non-depleted regions at the periphery of the photodiode which blocks the flow toward P+ region 314B and N+ region 318B of slow diffusing photogenerated charge carrier pairs arising in drift regions. This improves the photodiode speed of response.

Also, controlling the thickness of the buried field oxide layer 320 allows the creation of a dielectric reflector for improved light absorption efficiency. Furthermore, it is advantageous that the handling wafer at the backside of the photodiode is dielectrically isolated from the diode and therefore can be biased as required or grounded as a shield to minimize signal interference problems.

Figure 4:
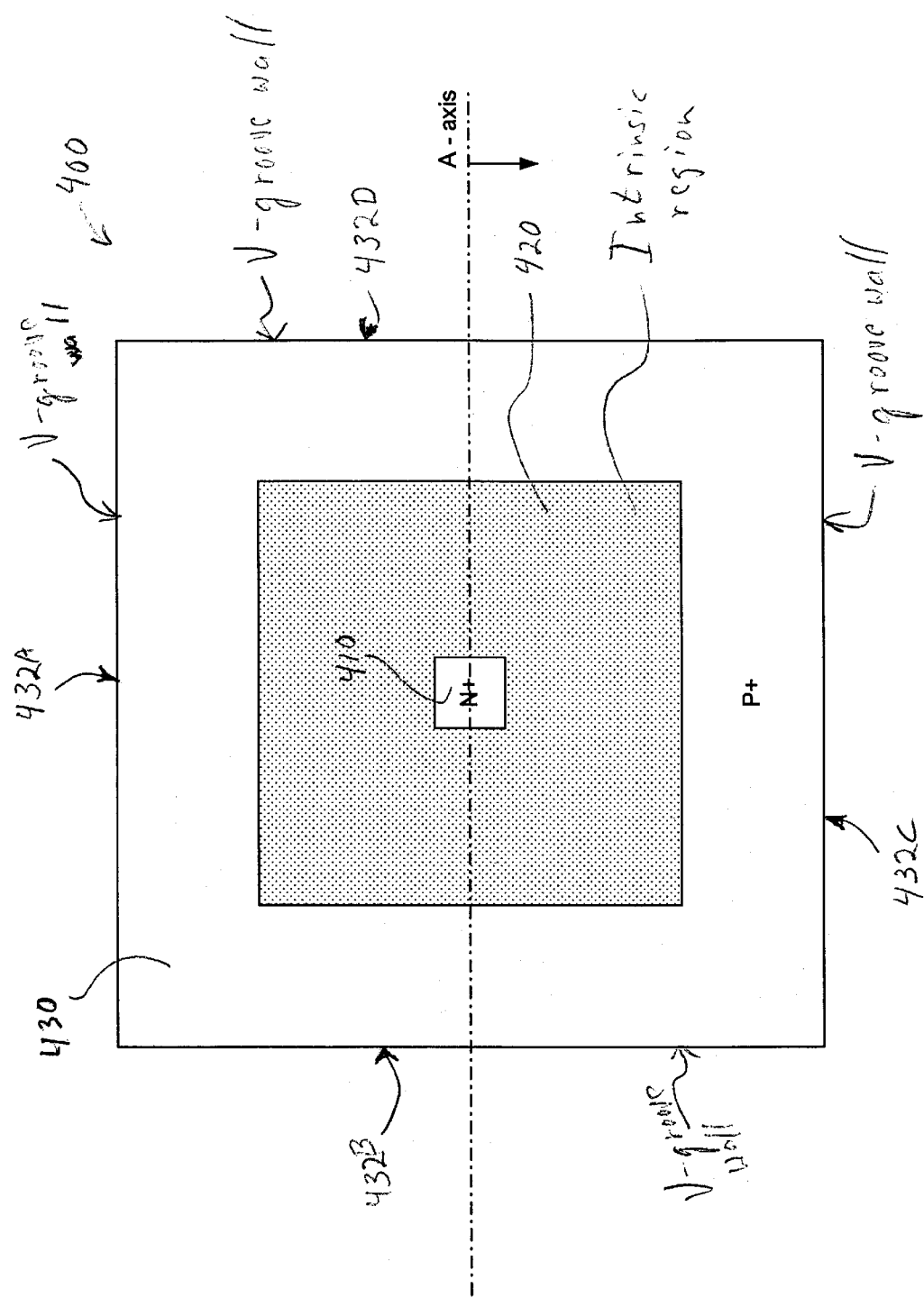
FIG. 4 is a diagram illustrating an overhead view of diffusion areas for an embodiment of a photodiode according to the present invention.
Figure 5:
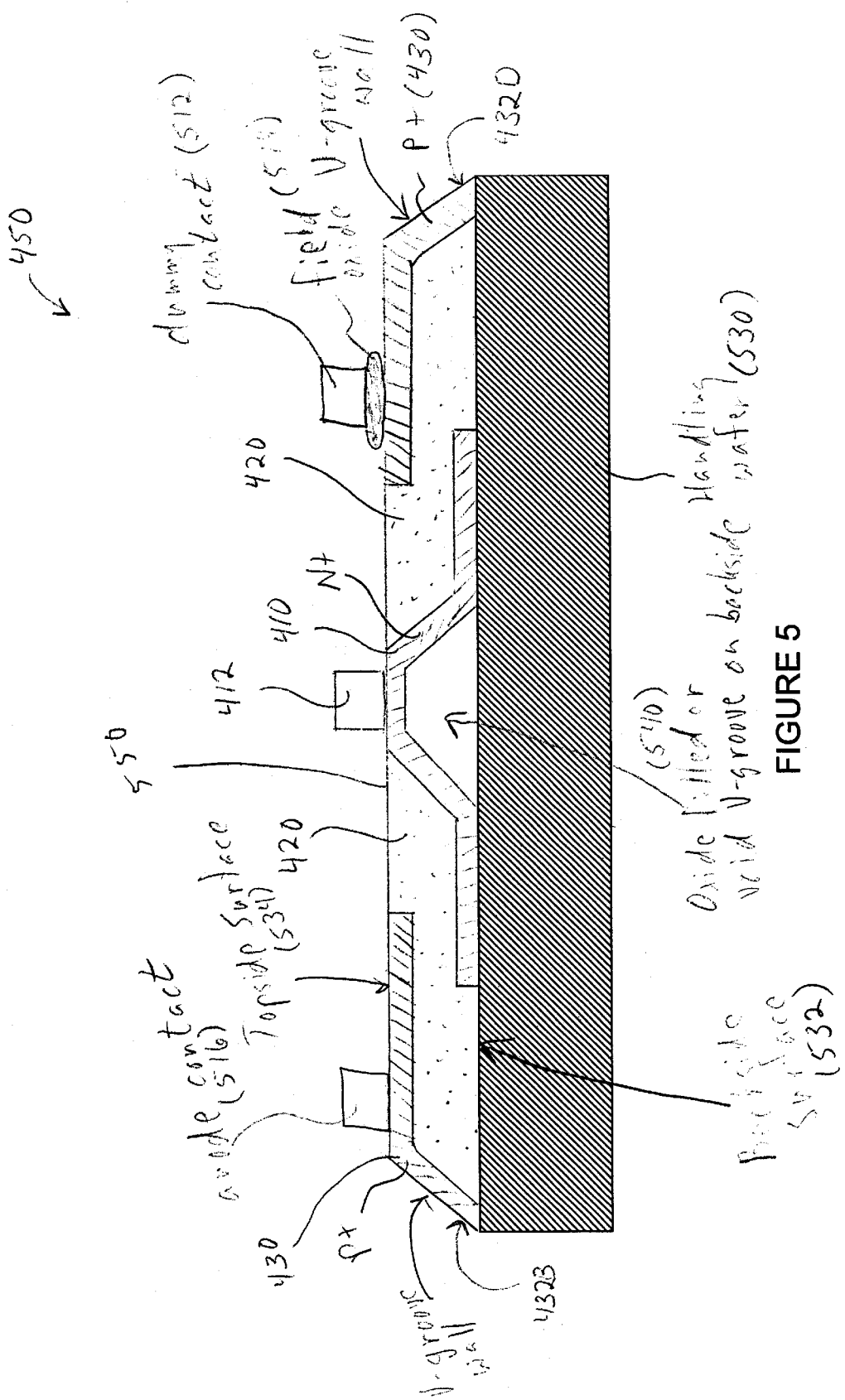
FIG. 5 is a cross-sectional view of an embodiment of a shielded photodiode according to the present invention having the diffusion area shown in FIG. 4.

Using the processes described above in connection with FIGS. 2A–L and FIGS. 3A–L, an embodiment of a shielded photodiode according to the present invention may be formed. FIG. 4 illustrates one embodiment 400 of doped and intrinsic regions on a topside surface of a portion of a fabrication wafer for a photodiode after the topside surface of the fabrication wafer has been lapped to expose an N+ region 410. FIG. 5 is a cross-sectional view of an embodiment of a shielded photodiode according to the present invention having the diffusion pattern shown in FIG. 4. Specifically, the process of FIGS. 3A–L may be adapted to produce the diffusion patterns, V-walls and V-grooves of FIGS. 4 and 5.

With regard to FIG. 4, the N+ region 410 has been diffused into a backside surface 532 of a fabrication wafer 550 and into a V-groove 540 etched into the backside surface 532. Such as is demonstrated above with respect to trenches 342A and 342B and N+ region 318 shown in FIGS. 3B and 3C. The V-groove 540 on the backside was filled with oxide and an oxide layer, which, in the interest of simplicity, are not shown, was formed on the backside surface 532. See FIGS. 3D and 3E. The V-groove 540 can also be left unfilled so that a void is formed.

The N+ region 410 was diffused through the oxide layer formed on the backside surface 532. The depth of the V-groove 540 and the thickness of the N+ region 410 are selected in order to form the minimum size contact area through the topside surface 534 that will ensure a reliable top cathode contact when the topside surface is lapped, as discussed below. The dimensions of the minimum size contact are determined by the desired contact resistance for the topside cathode and can be small enough that the resulting V-groove comes to virtually a point that intersects the topside surface rather than the stripe or square that is shown.

Using the process of FIGS. 2A–L, a trench with vertical sidewalls can be formed instead of the V-groove shown in FIG. 5. The trench will typically be of minimum size, i.e. width, that just ensures a reliable top cathode contact through the topside surface of the fabrication wafer after lapping, as discussed below.

A handling wafer 530 was then bonded to the backside surface 532 of the fabrication wafer 550. The fabrication wafer 550 and handling wafer 530 were then flipped and the topside surface of the fabrication wafer was lapped to expose a portion of the N+ region in the V-groove, which is illustrated in FIG. 4. See FIGS. 3F and 3G.

Using a process similar to that illustrated in the context of FIGS. 3B and 3C, V-grooves were formed in top surface 534 of the fabrication wafer 550 to produce an exposed region along the periphery of the resulting photodiode. These V-grooves were etched down to the handling wafer 530 to form walls 432A–D. P+ region 430 was formed on the topside surface 534 separately from the N+ region 410 and diffused into the V-groove walls 432A–D.

As noted above, FIG. 5 shows a cross-sectional view along the A-axis of FIG. 4 of a photodiode 450 according to the present invention. The N+ region 410 formed on the backside surface 532 of the fabrication wafer 550 is shown rising up, in the backside V-groove 540, to the topside surface 534 where a first contact 412, a cathode contact, provides a conductive connection to the N+ region 410. The first contact 412 is relatively small and provides a low resistance contact to the N+ region 410 and, because it is relatively small, presents a smaller area with correspondingly lower antenna effect.

The P+ region 430 is formed along the peripheral V-groove walls 432A–D and along the topside surface 534 and surrounds the N+ region 410 of the photodiode 450. The P+ region 430 and the N+ region 410 may overlap, as regards the portion of the top surface 534 into which P+ region 430 is formed and the portion of the backside surface 532 into which N+ region 410 is formed, but are isolated from one another by intrinsic region 420 of fabrication wafer 550. In other words, in some portions of the photodiode, when viewed along lines that are perpendicular to the top surface 534 of fabrication wafer 550, the N+ region 410 and P+ region 430 overlap such that the lines will intersect both the N+ region 410 and P+ region 430.

A second contact 516, an anode contact, is formed that makes a conductive connection to the P+ region 430 so that the P+ region can be grounded. The P+ region 430 will then shield the photodiode 450, but will also be transparent to light, which will allow the light to pass through into the active region of the photodiode 450 within intrinsic region 420 between the P+ region 430 and the N+ region 410 where it will form charge carrier pairs that will be collected by regions 430 and 410. Thus, the effective size of the photodiode is increased. The anode connection 516 to the P+ region 430 can be made anywhere on the P+ diffusion along the topside surface 534.

However, an additional contact, such as a metal contact, can alternatively be formed on the P+ region 430 along at least a portion of the V-groove walls 432A–D. The second contact is formed so as to surround a substantial portion of the photodiode or even completely surround the photodiode with a shielding ring contact. When the second contact is connected to a power supply voltage, such as a ground potential, then the second contact shields the photodiode from noise signals, such as ambient noise and feedback signals. The second contact may take a form similar to the contacts 716A and 716B shown in FIG. 7.

The complete shielding of the photodiode 450 by having the P+ region 430 surround the edges of the photodiode has several benefits. One benefit, which applies primarily to non-differential receivers, arises where the P+ region 430 is grounded and the photodiode 450 is mounted on a grounded lead frame. In this configuration, the N+ active input region 410 is well shielded leaving only the bond wire as the dominate pickup antenna. Because the periphery of a conventional PIN photodiode may typically exceed the pickup of the active bond wire, the noise immunity of the shielded photodiode 450 of the present invention can be approximately 6–20 dB better than a conventional non-shielded type of photodiode.

An additional 15–30 dB of noise immunity can be achieved by using a differential bond wire as a dummy contact that is tied between a dummy connection on the photodiode and a differential input on a receiver IC. FIG. 5 shows a dummy contact 512 formed on top of a field oxide region 512 that electrically isolates the dummy contact 512 from the P+ region 430. The bond wire for dummy contact 512 is disposed parallel to the active bond wire for contact 412 and in close proximity to the active bond wire so as to pickup approximately the same noise signal as the active bond wire. The dummy bond wire will allow the noise signal to be cancelled by the differential receiver. However, this differential bond wire technique may be less effective if another large antenna is present, such as the photodiode N+ periphery, since the noise pickup from the large antenna will dominate.

The dummy contact 512 can be formed on the topside surface 534 of the fabrication wafer 550 adjacent to, but separate from, the first contact 412 and should have substantially the same pickup capacitance, e.g. noise coupling capacitance, as the first contact 412. The dummy contact 512 can be electrically isolated from the photodiode 450 by forming a region of field oxide 514 on the topside surface 534 and forming the dummy contact 512 on top of the field oxide 514.

FIGS. 6 and 7 illustrate another embodiment of a photodiode 650 according to the present invention. This embodiment does not have a continuous P+ region, such as P+ region 430 of FIGS. 4 and 5, that completely surrounds the periphery of the diode and so does not have the same level of shielding. This embodiment also features a metal contact 716A and 716B that is isolated from N+ region 610 and bridges the two P+ regions 630A and 630B shown in FIG. 6 or along a P+ region (not illustrated) that may be formed to join regions 630A and 630B. One of ordinary skill in the art will readily recognize that the P+ regions 630A and 630B need only be electrically connected and many approaches may be taken that obtain an electrical connection. The main point here is that the P+ region need not completely surround the N+ region, as illustrated in the photodiode of FIGS. 4 and 5, but may flank or partially surround the N+ region and still obtain an improvement in performance for the resulting photodiode.

Note that P+ regions 630A and 630B extend to edges 632A and 632C of the fabrication wafer. P+ region 630A includes V-groove wall 632B that is P+ doped and P+ region 630B include V-groove wall 632D that is P+ doped. Note also that the P+ regions 630A and 630B overlap N+ region 610 in certain planes perpendicular to the topside surface 734 and are separated from one another by intrinsic region 620.

Further, as discussed above, the intrinsic region 620 may be formed to be very thin using the fabrication technique described above wherein handling wafer 730 is bonded to a fabrication wafer with N+ region 610 formed along a V-groove 740, which may optionally be filled with oxide, and, optionally, along a portion of backside surface 732 of the fabrication wafer. The topside surface 734 of the fabrication wafer may then be lapped to obtain the desired thickness before forming P+ regions 630A and 630B. Note that the depth of the V-groove 740 should be selected such that lapping of the topside surface 734 exposes a portion of N+ region 610.

Contact 612 is formed on a portion of N+ region 610 exposed along topside surface 734. With regard to the metal contact illustrated in cross section as contact regions 716A and 716B, the metal contact will tend to block light from reaching some portions of the diode, though the higher conductivity of the metal contact may provide a higher level of shielding in some circumstances.

The photodiode shown in FIGS. 6 and 7 may also be adapted to operate as a differential photodiode. For example, the contact 612 to active region 610 may be used as a common contact and the contacts 716A and 716B to active regions 630A and 630B, respectively, may be separately input to differential inputs of a differential amplifier. One of the active regions 630A or 630B can then be screened by an opaque material in order to obtain differential operation from the photodiode. In this differential photodiode mode, the doping of the active regions is preferably reversed such that active region 610 is a P+ region and active regions 630A and 630B are N+ regions.

The photodiode of the present invention obtains good speed performance and good noise performance when combined with a suitable receiver. It is also suitable for use with low cost packaging methods.

One of skill in the art will readily appreciate that variations can be made upon the embodiments disclosed herein without departing from the teachings of the present invention. For instance, the shape of the photodiode shown in FIG. 4 is rectangular, but the photodiode can be fabricated in a variety of shapes, including circular. In view of the wide variety of embodiments to which the principles of the invention can be applied, it should be understood that the illustrated embodiments are exemplary only, and should not be taken as limiting the scope of the present invention.

We claim:

1. A PIN photodiode produced by the process of:
   providing a first semiconductor substrate lightly doped with one of first and second dopant types, the first semiconductor substrate having first and second planar surfaces;
   forming a first void in the first planar surface of the first semiconductor substrate, the first void having walls that intersect the first planar surface;
   diffusing the walls of the first void with the first dopant type to form a first active region;
   forming a first oxide layer on the first planar surface of the first semiconductor substrate;
   bonding a first surface of a second semiconductor substrate to the first planar surface of the first semiconductor substrate;
   lapping the second planar surface of the first semiconductor substrate to expose a portion of the first active region;
   selectively masking and diffusing a predetermined portion of the second planar surface of the first semiconductor substrate with the second dopant type to form a second active region including selecting the predetermined portion of the second planar surface such that the second active region substantially surrounds the first active region and etching the periphery of the predetermined portion of the second planar surface to form peripheral walls for the second active region;
   etching the periphery of the predetermined portion of the second planar surface to form peripheral walls for the second active region;
   forming a first contact adjacent to the exposed portion of the first active region; and
   forming a second contact adjacent to at least a portion of the second active region including forming the second contact along substantially all of a periphery of the second active region and along the peripheral walls of the second active region.

2. The PIN photodiode produced by the process of claim 1, where the step of etching the periphery of the predetermined portion of the second planar surface to form peripheral walls includes one of forming V-grooves along the periphery of the predetermined portion of the second planar surface and forming trenches along the periphery of the predetermined portion of the second planar surface.

3. A PIN photodiode produced by the process of:
   providing a first semiconductor substrate lightly doped with one of first and second dopant types, the first semiconductor substrate having first and second planar surfaces;
   forming a first void in the first planar surface of the first semiconductor substrate, the first void having walls that intersect the first planar surface;
   diffusing the walls of the first void with the first dopant type to form a first active region by diffusing a portion of the first planar surface of the first semiconductor substrate that is contiguous with the walls of the first void with the first dopant type;
   forming a first oxide layer on the first planar surface of the first semiconductor substrate;
   bonding a first surface of a second semiconductor substrate to the first planar surface of the first semiconductor substrate;
   lapping the second planar surface of the first semiconductor substrate to expose a portion of the first active region;
   selectively masking and diffusing a predetermined portion of the second planar surface of the first semiconductor substrate with the second dopant type to form a second active region by selecting the predetermined portion of the second planar surface such that a portion of the second active region surrounds the contiguous portion of first planar surface of the first semiconductor substrate;
   forming a first contact adjacent to the exposed portion of the first active region; and
   forming a second contact adjacent to at least a portion of the second active region.

4. A PIN photodiode produced by the process of:
   providing a first semiconductor substrate lightly doped with one of first and second dopant types, the first semiconductor substrate having first and second planar surfaces;
   forming a first void in the first planar surface of the first semiconductor substrate, the first void having walls that intersect the first planar surface;
   diffusing the walls of the first void with the first dopant type to form a first active region;
   forming a first oxide layer on the first planar surface of the first semiconductor substrate;
   bonding a first surface of a second semiconductor substrate to the first planar surface of the first semiconductor substrate;

lapping the second planar surface of the first semiconductor substrate to expose a portion of the first active region;

selectively masking and diffusing a predetermined portion of the second planar surface of the first semiconductor substrate with the second dopant type to form a second active region;

forming a first contact adjacent to the exposed portion of the first active region;

forming a second contact adjacent to at least a portion of the second active region;

selectively masking and forming an insulating layer pattern on a portion of the second planar surface separate from the first contact and adjacent to the first contact; and forming a third contact on the insulating layer pattern.

5. A PIN photodiode produced by the process of:

providing a first semiconductor substrate lightly doped with one of first and second dopant types, the first semiconductor substrate having first and second planar surfaces;

forming a first void in the first planar surface of the first semiconductor substrate, the first void having walls that intersect the first planar surface;

diffusing the walls of the first void with the first dopant type to form a first active region;

forming a first oxide layer on the first planar surface of the first semiconductor substrate;

bonding a first surface of a second semiconductor substrate to the first planar surface of the first semiconductor substrate;

lapping the second planar surface of the first semiconductor substrate to expose a portion of the first active region;

selectively masking and diffusing a predetermined portion of the second planar surface of the first semiconductor substrate with the second dopant type to form a second active region by diffusing first and second predetermined portions of the second planar surface of the first semiconductor substrate with the second dopant type;

forming a first contact adjacent to the exposed portion of the first active region;

forming a second contact adjacent to at least a portion of the second active region by forming the second contact adjacent the first predetermined portion of the second planar surface and forming a third contact adjacent to the second predetermined portion of the second planar surface; and forming an opaque layer over the second predetermined portion of the second planar surface.

6. A PIN photodiode, the photodiode comprising:

a first semiconductor substrate having first and second planar surfaces, the first semiconductor substrate being composed of intrinsic material and having formed therein a void having walls intersecting the first planar surface;

a first active region disposed along the void and intersecting a first portion of the second planar surface of the first semiconductor substrate, the first active region having a first dopant type;

a second active region disposed within the first semiconductor substrate adjacent to a second portion of the second planar surface of the first semiconductor substrate, where the second portion of the second planar surface of the first semiconductor substrate substantially surrounds the first portion of the second planar surface, and where the second active region is spaced apart from the first active region so as to form an intrinsic region interposed the first and second active regions, the second active region having a second dopant type;

a first contact disposed within at least part of the first portion of the second planar surface and electrically coupled to the first active region; and a second contact disposed within at least pan of the second portion of the second planar surface and electrically coupled to the second active region.

7. The PIN photodiode of claim 6, the photodiode further including sidewalls formed along a periphery of the second portion of the second planar surface and intersecting the first and second planar surfaces, the sidewalls being diffused with the second dopant type such that the sidewalls function as part of the second active region.

8. The PIN photodiode of claim 7, where the second contact is disposed along the sidewalls.

9. The PIN photodiode of claim 7, where the void is filled with an insulating material.

10. The PIN photodiode of claim 7, the photodiode further including a third contact disposed substantially adjacent to the first contact and electrically isolated from the first and second active regions and the intrinsic region.

11. The PIN photodiode of claim 7, where:

the first active region is further disposed along a portion of the first planar surface of the semiconductor substrate adjacent to the void and intersecting the walls of the void; and a portion of the second active region overlaps at least part of the first active region disposed along the portion of the first planar surface of the semiconductor substrate adjacent to the void.

* * * * *